United States Patent [19]

Paul et al.

[11] 4,141,080
[45] Feb. 20, 1979

[54] MAGNETO-RESISTIVE READOUT OF A CROSS-TIE WALL MEMORY SYSTEM USING A PROBE AND CRESCENT

[75] Inventors: Maynard C. Paul; Leslie H. Johnson; David S. Lo, all of St. Paul, Minn.

[73] Assignee: Sperry Rand Corporation, New York, N.Y.

[21] Appl. No.: 870,045

[22] Filed: Jan. 16, 1978

Related U.S. Application Data

[62] Division of Ser. No. 715,462, Aug. 18, 1976, abandoned.

[51] Int. Cl.² ............................................. G11C 19/08
[52] U.S. Cl. .................................................... 365/87
[58] Field of Search .................................. 365/87, 171

[56] References Cited

U.S. PATENT DOCUMENTS 4,034,359  7/1977  Torok et al. ........................ 365/87

Primary Examiner—James W. Moffitt
Attorney, Agent, or Firm—Kenneth T. Grace; William E. Cleaver; Marshall M. Truex

[57] ABSTRACT

A method of and an apparatus for reading out the informaton that is stored in the magnetizable layer of a cross-tie wall memory system is disclosed. A first embodiment of the apparatus utilizes: a conductive probe, that along its length and is conductively coupled to the magnetizable layer and the tip which is centered at or near the Bloch-line position in the memory segment of the cross-tie wall; a conductive crescent that is oriented concentric to the probe tip and that along its length is conductively coupled to the magnetizable layer; and a readout device that is coupled across the probe and crescent for determining the resistance in the magnetizable layer between the probe tip and crescent as an indicaton of the existence or non-existence of a Bloch-line in the memory segment.

2 Claims, 8 Drawing Figures

MAGNETO-RESISTIVE READOUT OF A CROSS-TIE WALL MEMORY SYSTEM USING A PROBE AND CRESCENT

This is a division of application Ser. No. 715,462, filed Aug. 18, 1976 and now abandoned.

BACKGROUND OF THE INVENTION

The propagation of inverted Néel wall sections in a serial access memory system was first proposed by L. J. Schwee in the publication "Proposal On Cross-Tie Wall and Bloch Line Propagation In Thin Magnetic Films", IEEE Transactions On Magnetics, MAG 8, No. 3, pp. 405-407, September 1972. Such a memory system utilizes a ferromagnetic film of 81% Ni 19% Fe of approximately 300 Angstroms (Å) thickness in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such cross-tie wall memory system, information is entered at one end of the serial access memory system by the generation of an inverted Néel wall section bounded by a cross-tie on one side and a Bloch-line on the other, which is representative of a stored binary 1, and a non-inverted Néel wall section (i.e., the absence of a cross-tie and Bloch-line pair), which is representative of a stored binary 0 and is moved or propagated along the cross-tie walls by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in a Naval Ordnance Laboratory Report NOLTR 73-185, Oct. 1, 1973, L. J. Schwee, et al, there have been published some recent results of the further development of cross-tie wall memory systems and of detectors for the readout of the binary information that is stored therein.

In the copending patent application of E. J. Torok, et al, Ser. No. 608,437 filed Aug. 8, 1975, now U.S. Pat. No. 4,034,359, disclosed a novel method of and a configuration for reading out the information that is stored in the magnetizable layer of a cross-tie wall memory system. The novel configuration includes: conductively coupling a conductive pillar to the magnetizable layer at or near the Bloch-line position in the memory segment of the cross-tie wall; conductively coupling to the magnetizable layer, concentric to the pillar, a conductive ring; coupling an electrical signal across the pillar and ring; and, determining the resistance in the magnetizable layer between the pillar and ring as an indication of whether or not a Bloch-line in stored in the memory segment. In this prior art configuration, because of the use of a concentric ring and a small diameter pillar, several deposition steps are required as a very small hole must be formed in an insulating layer. A deposited conductor is required to couple the pillar to an external lead for the readout function, which deposited conductor must pass over the concentric ring, separated from it by an insulative layer, and the superposed portion of the deposited conductor. The deposited conductor can possibly be electrically shorted to the ring such that considerable degradation of the readout signal may be experienced. The present invention is directed toward an improvement in such prior art configuration in which a probe and a concentric crescent are deposited directly upon the magnetizable layer during the same deposition step while further obviating the necessity of the deposited conductor and special insulating layer and their possible adverse affects upon system operation.

SUMMARY OF THE INVENTION

The present invention is directed toward a novel method of and a configuration for reading out the information that is stored in the magnetizable layer of a cross-tie wall memory system. The invention includes: simultaneously forming (a) a conductive probe directly upon the magnetizable layer at or near the Bloch-line position in the memory segment of the cross-tie wall, and (b) a conductive crescent directly upon the magnetizable layer, concentric to the probe; coupling an electrical signal across the probe and crescent; and, determining the resistance in the magnetizable layer between the probe and crescent as an indication of whether or not a Bloch-line is stored in the memory segment.

DESCRIPTION OF THE PREFERRED EMBODIMENT

Figure 1:
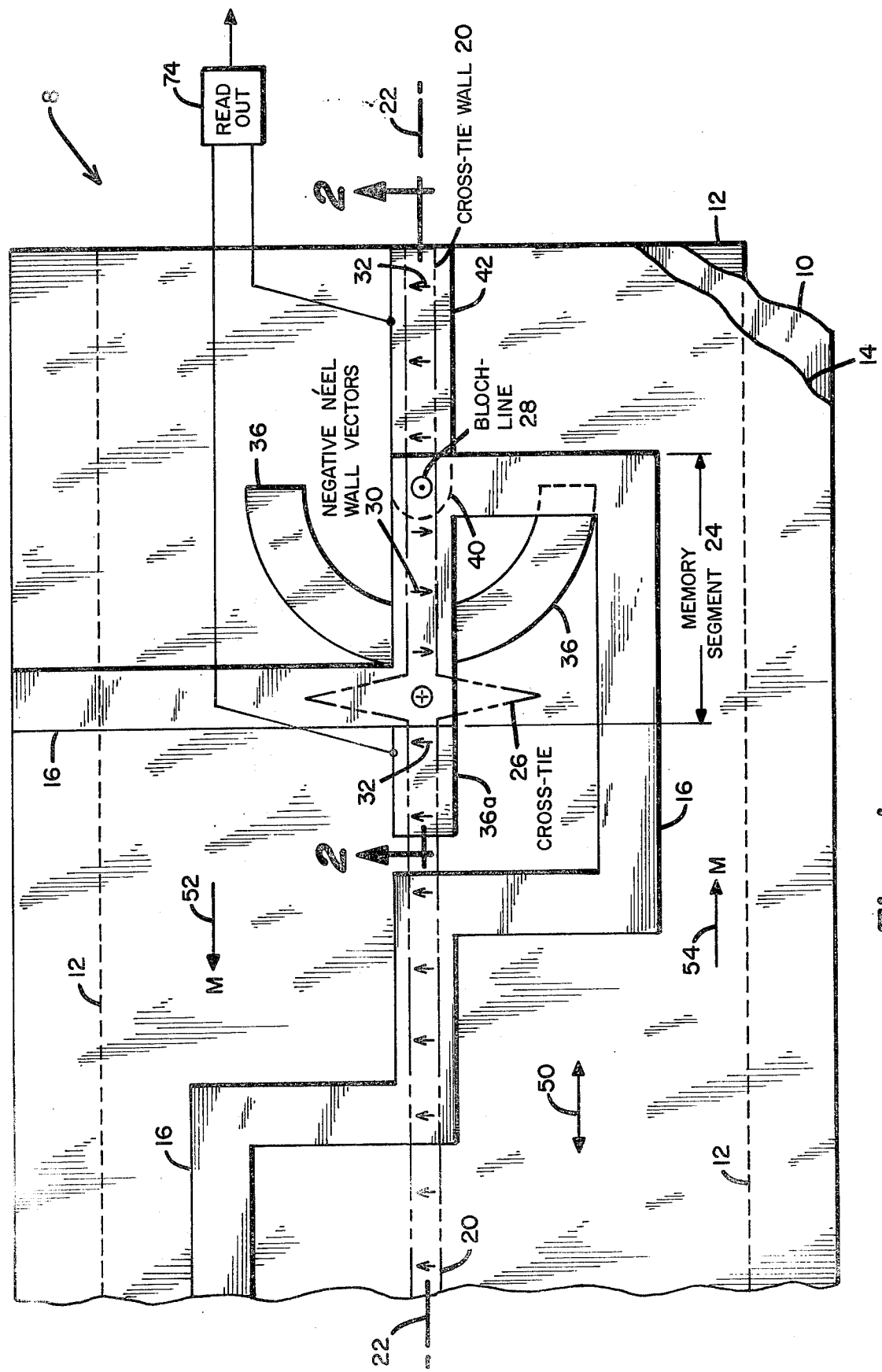
FIG. 1 is a schematic illustration of a portion of a cross-tie wall memory system illustrating, in detail, the magneto-resistive detector of the present invention.

FIG. 1 is an illustration of a portion of a prior art cross-tie memory system into which the magneto-resistive detector 8 of the present invention is incorporated. This prior art cross-tie memory system may be similar to that of the hereinabove referenced D. S. Lo, et al, U.S. Pat. No. 3,906,466 and includes a non-magnetizable, e.g., glass, substrate member 10 having a copper microstrip 12 affixed to its bottom surface and a thin ferromagnetic layer 14 affixed to its top surface. Affixed to the top surface of layer 14 and superposed the microstrip 12 is a copper drive line 16 which is superposed layer 14, but separated therefrom by an insulative, e.g., SiO or Mylar, member 18--- see FIG. 2. Drive line 16 consists of a plurality of serially-intercoupled portions, alternate ones of which define a memory cell, that are overlaid and are uniformly spaced along a cross-tie wall 20 oriented along a longitudinal axis 22.

In accordance with the hereinabove referenced D. S. Lo, et al, U.S. Pat. No. 3,906,466, there is stored in the memory segment 24 an invented Néel wall section, bounded by a cross-tie 26 on one end and a Bloch-line 28 on the other end, representative of the storage of a binary 1 in memory segment 24. Such inverted Néel wall section is represented by the negative Néel wall vectors 30 pointed in a downwardly direction while the remaining portion, i.e., the non-inverted Néel wall section, of the cross-tie wall is represented by the positive Néel wall vectors 32 pointed in an upwardly direction. If such representative memory segment 24 were to be redrawn for the purpose of illustrating the storage of a binary 0, the cross-tie 26, Bloch-line 28 pair illustrated in memory segment 24 would be deleted with the cross-tie wall 20 being represented by a continuation of the positive Néel wall vectors 32 throughout the cross-tie wall 20, including memory segment 24.

Figure 2:
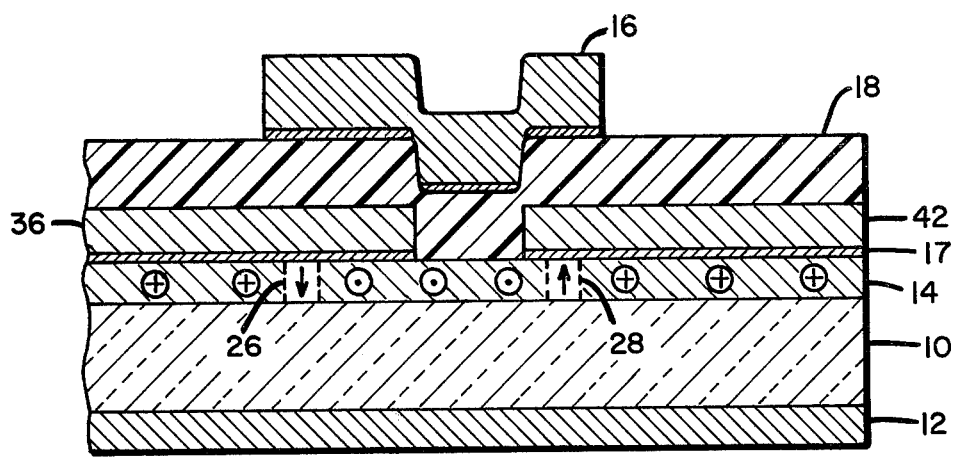
FIG. 2 is an illustration of a cross-sectional view of the detector of FIG. 1 taken along line 2—2 thereof.

With particular reference to FIG. 2 there is presented a cross-sectional view of the detector 8 of FIG. 1 taken along line 2—2 thereof for the purpose of illustrating the stacked, superposed elements of FIG. 1 and the magnetic vector representations thereof. FIGS. 1, 2 illustrate that the detector 8 illustrated therein includes a non-magnetizable, e.g., glass, substrate member 10 having a thin ferromagnetic layer 14 affixed to its top surface. Conductively affixed to the top surface of layer 14 and oriented concentric about Bloch-line 28 is, e.g., gold crescent 36. Conductively coupled to layer 14 and centered over the Bloch-line 28 position in memory segment 24 is the tip 40 of a gold probe 42. Thus, both conductive crescent 36 and conductive probe 42 and its tip 40 are conductively coupled to layer 14, all being centered about Bloch-line 28 in memory segment 24. A chromium layer 17 may be utilized to provide better adhesion of the crescent 36 and the probe 42 to the layer 14. Next, overlaying the exposed surfaces of layer 14, crescent 36, and probe 42 and affixed thereto by a suitable insulative adhesive, there is provided an insulative, e.g., SiO or Mylar, layer 18. Lastly, affixed to the top surface of insulative layer 18 is the copper drive line 16 having the planar conformation illustrated in FIG. 1 and, in more detail, in the hereinabove referenced D. S. Lo, et al, U.S. Pat. No. 3,906,466. Note that layer 14 has an easy axis 50 with the magnetization M thereof above the cross-tie wall 20 being aligned in a leftward direction denoted by vector 52 and below the cross-tie wall 20 being aligned in a rightward direction denoted by vector 54.

Figure 3:
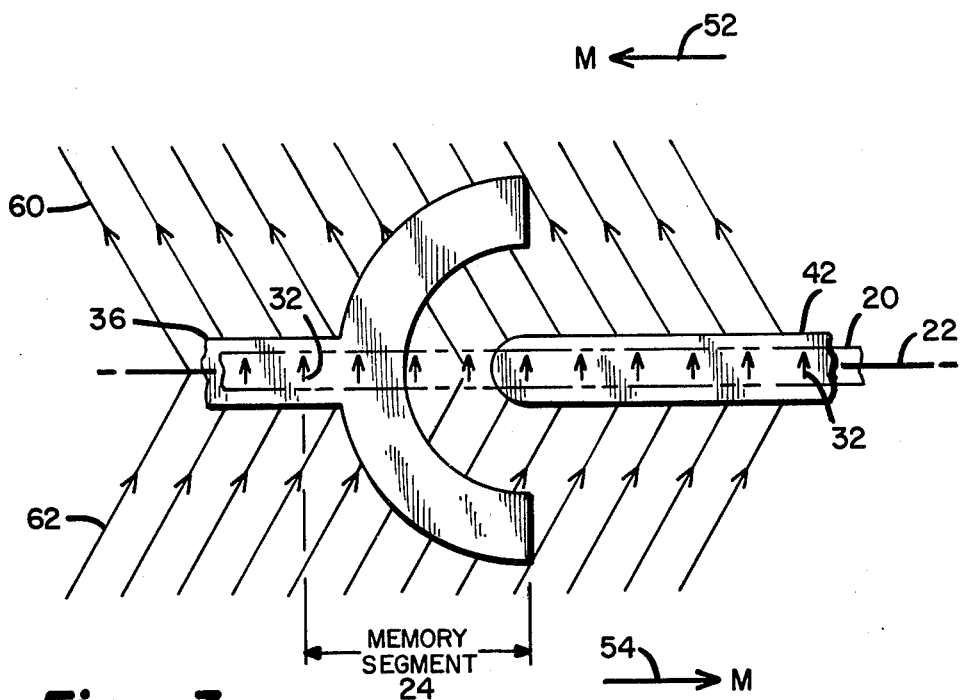
FIG. 3 is a schematic illustration of the magnetic vector orientations in the area of the memory segment of FIG. 1 with no cross-tie, Bloch-line pair stored therein.

With particular reference to FIG. 3 there is presented a schematic illustration of the magnetic vector orientations in the area of memory segment 24 of FIG. 1 with no cross-tie Bloch-line pair stored therein. In this condition, with no Bloch-line 28 positioned under the tip 40 of probe 42, with the Néel wall vectors within cross-tie wall 20 all oriented in an upwardly directed positive Néel wall vector 32 orientation, the nearby magnetization M, i.e., the near field, on either side of the cross-tie wall 20 is oriented in the vector orientations 60 and 62. Further from the cross-tie wall 20, the magnetization M, i.e., the far field, in layer 14 is oriented—see the above referenced U.S. Pat. No. 3,906,466—parallel to the magnetization M orientations of vectors 52 and 54, respectively.

Figure 4:
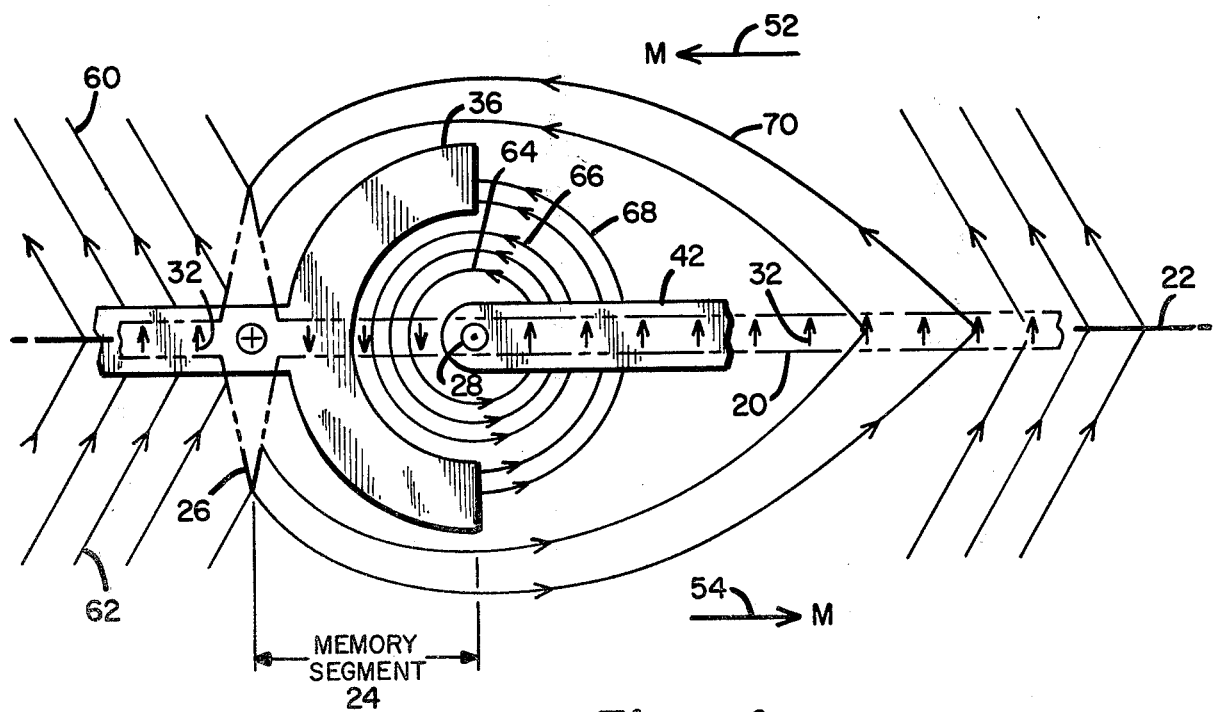
FIG. 4 is a schematic illustration of the magnetic vector orientations in the area of the memory segment of FIG. 1 with a cross-tie, Bloch-line pair stored therein.

With particular reference to FIG. 4 there is presented a schematic illustration of the magnetic vector orientations in the area of memory segment 24 of FIG. 1 with a cross-tie, Bloch-line pair stored therein. Under this condition, with the tip 40 of probe 42 centered above Bloch-line 28, the Néel wall vectors within the inverted Néel wall section bounded by cross-tie 26 and Bloch-line 28 are oriented in a downwardly directed negative Néel wall vector 30 orientation while the Néel wall vectors without such memory section 24 are oriented in the upwardly directed positive Néel wall vector 32 orientation. Under this condition, with the magnetic vectors on opposite sides of Bloch-line 28, and, accordingly, tip 40, oriented in opposite directions, there is generated about Bloch-line 28, and, accordingly, tip 40, the magnetic vectors 64, 66, 68, 70 that are oriented in a generally counterclockwise direction about tip 40.

Figure 5:
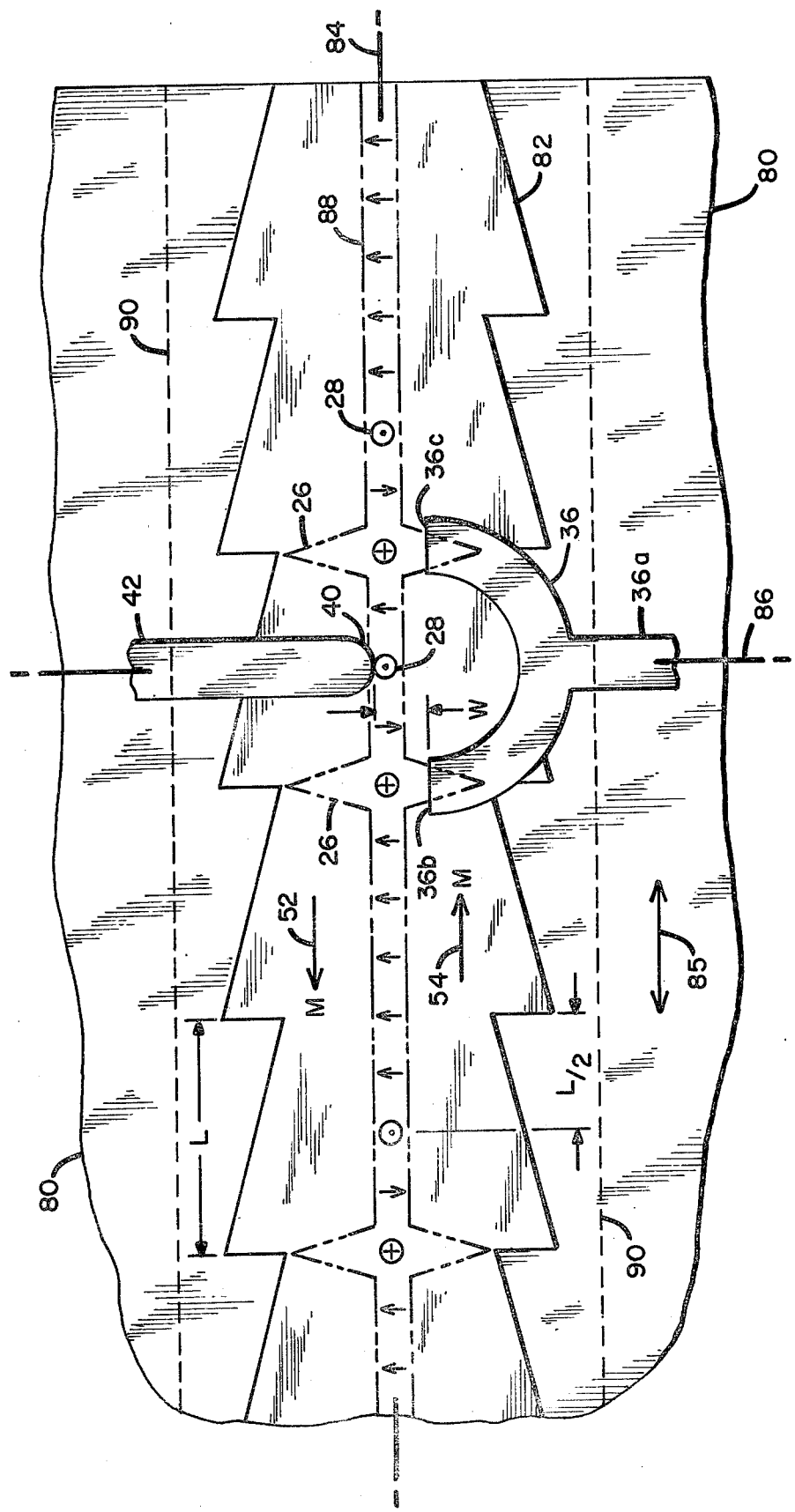
FIG. 5 is a schematic illustration of a portion of a cross-tie wall memory system illustrating, in detail, a second embodiment of the present invention.

With particular reference to FIG. 5 there is presented an illustration of a second embodiment of the present invention. In this second embodiment, there is shown a glass substrate member 80 having a thin ferromagnetic layer 82 affixed to the top surface thereof. Layer 82 is symmetrical about its longitudinal axis 84 having a serrated conformation and the easy axis 85 such as taught by the publication, AIP Conference Proceedings, No. 29, 21st Annual Conference On Magnetism and Magnetic Materials, 1975, published April 1976, L. J. Schwee, et al, pages 624–625.

In the embodiment of FIG. 5, crescent 36 and probe 42 are oriented about a longitudinal axis 86 that passes through the Bloch-line 28 position on cross-tie wall 88 and that is perpendicular to longitudinal axis 84. Also, the tips 36b, 36c of crescent 36 and the tip 40 of probe 42 may be separated a distance W that is substantially $\frac{1}{4}$ to $\frac{1}{2}$ the length of a cross-tie 26, e.g., 6 to 12 microns ($\mu$m) while the inside diameter L of the crescent 36 is substantially the distance between adjacent cross-tie 26 positions along cross-tie wall 88 as determined by the distance between adjacent serrations in layer 82, e.g., 25 $\mu$m. Also provided is a copper microstrip 90 affixed to the bottom surface of substrate member 80.

Figure 6:
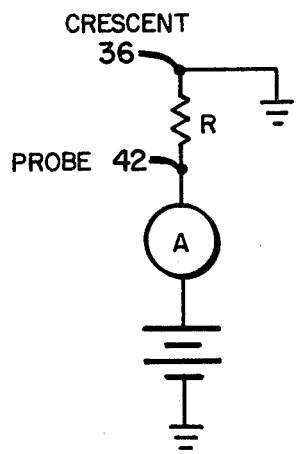
FIG. 6 is a circuit schematic of a first embodiment of the sense amplifier of FIG. 1.

With particular reference to FIG. 6 there is presented a circuit schematic of a first embodiment of the sense amplifier 74 of FIG. 1. In this configuration of sense amplifier 74, there is utilized a voltage source E that is serially coupled through an ammeter A to probe 42. Crescent 36 is, in turn, coupled to ground with the measurement of the current as indicated by the ammeter A giving an indication of the magnitude of the resistance R in that portion of layer 14 between probe 42 and crescent 36.

Figure 7:
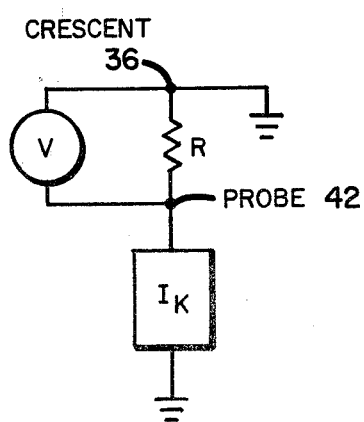
FIG. 7 is a circuit schematic of a second embodiment of the sense amplifier of FIG. 1.

With particular reference to FIG. 7 there is presented a circuit schematic of a second embodiment of the sense amplifier 74 of FIG. 1. In this configuration of sense amplifier 74, a constant current source $I_K$ is coupled to probe 42 while crescent 36 is, in turn, coupled to ground. Then, a voltmeter V is coupled across probe 42 and crescent 36, the voltage reading of which provides an indication of the resistance R of that portion of layer 14 between probe 42 and cresent 36.

By placing a crescent and probe conductor directly upon the ferromagnetic layer in the memory segment, either by vacuum deposition or any other appropriate technique, so that electrical contact is made between the probe and the crescent, through the ferromagnetic layer, one may utilize the magneto-resistive effect in the layer to differentiate between a stored 1 and a stored 0. The detector 8 may be aligned along the cross-tie wall 22 as shown in FIGS. 3 and 4 and current is passed through the probe 42, across the ferromagnetic layer 14 in the area between the probe 42 and the crescent 36 and is collected by the crescent 36. Both the conductive crescent and probe are deposited directly on the ferromagnetic film layer, preferably during the same deposition step. Some of the current will pass through parallel areas of the ferromagnetic layer. However, most of the current will take the path of least resistance which is the short path between the probe and the crescent.

Where no Bloch-line is present, as for the storage of a 0 as illustrated in FIG. 3, current leaving the probe 42 travels in a path that is essentially parallel to the lines of magnetization M direction in ferromagnetic layer 14. This maximum resistance situation is illustrated in FIG. 3. FIG. 4, in contrast, illustrates the minimum resistance situation for a stored 1. In this magnetization M distribution situation the current passing from the probe 42 to the crescent 36 crosses lines of magnetization M direction that are essentially perpendicular. It is to be noted that the orientation of the magnetization M direction between the probe tip 40 and the crescent 36, for a stored 0, may be altered locally so as to optimize parallelism of current and magnetization M by applying a small amplitude magnetic field $H_T$ that is oriented transverse to the cross-tie wall 20 and in the plane of the layer 14.

THEORY OF OPERATION

Figure 8:
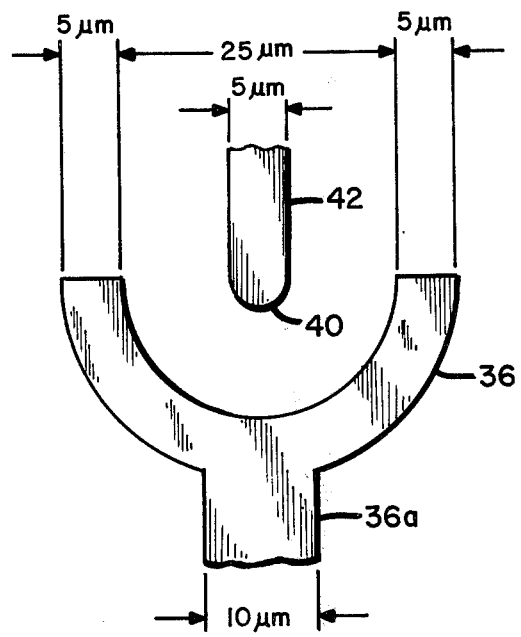
FIG. 8 is a detail of the probe and crescent of the detector of FIG. 1.

With particular reference to FIG. 8 there is presented a detailed illustration of a preferred embodiment of the probe and crescent of the detector 8 of the present invention. In the preferred embodiment of the present invention a probe 42 of 5 microns ($\mu$m) width and a crescent 36 of 25 microns inside diameter, each of a thin conductive material, e.g., a chromium adhesive layer 100 to 300 Angstroms (Å) followed by a gold layer 1,000 to 5,000 Angstroms (Å) in thickness, are both deposited and etched during the same deposition and etching steps, e.g., directly upon the top surfaces of substrate member 80 and layer 82 of FIG. 5.

FIG. 3 illustrates the magnetization M distribution along and in the vicinity of a cross-tie wall 20 that is representative of the absence of a cross-tie, Bloch-line pair stored in memory segment 24 wherein the magnetization M distribution is illustrated as being oriented at an angle approximately 60° to the long axis 22 of cross-tie wall 20. Of course it is to be appreciated that the magnetization M orientation within the layer 14 substantially further away from the cross-tie wall 20 would be parallel to the longitudinal axis 22 as represented by the vectors 52, 54.

FIG. 4, in contrast, illustrates the magnetization M distribution along and in the vicinity of a cross-tie wall 20 representative of a presence of a cross-tie, Bloch-line pair stored in memory segment 24 wherein the magnetization M distribution is illustrated as being substantially circular about Bloch-line 28. With no cross-tie, Bloch-line pairs being stored in the next adjacent lefthand and righthand memory segment 24 along cross-tie wall 20, representative of the storage of 0's, the magnetization M distribution is seen as curving into and out of the Néel wall portion of the cross-tie wall forming a wedge-like pattern to the right.

The equations describing the relationship between resistance and current direction are as follows:

$$\Delta R = \Delta R_{MAX} \cos^2 \theta \quad (1)$$

where
$\Delta R_{MAX}$ = maximum resistance change possible $\theta$ = angle between M and sensing current direction $\Delta R$ = change in R from the minimum R value (= R $- R_{MIN}$)

$$R = (R_{MAX} - R_{MIN}) \cos^2 \theta + R_{MIN} \quad (2)$$

or $$R = \Delta R_{MAX} \cos^2 \theta + R_{MIN}.$$

For a data bit "0," $\theta \cong 0°$, so $$R\cdot\text{``0''} = \Delta R_{MAX} = R_{MIN}.$$

For a data bit "1," $\theta \cong 90°$, so $$R\cdot\text{``1''} = R_{MIN}.$$

The difference between these resistances is $R\cdot\text{``0''} - R\cdot\text{``1''} = \Delta R_{MAX}$. For a NiFe cross-tie film, $\Delta R_{MAX}$ is conservatively 1% of the maximum resistance. The resistance of the 350Å NiFe film between crescent and probe, assuming
$R = 10\Omega/\text{sq.}$, and $\rho = 35 \mu\Omega\text{cm}$, where
$R = \rho l/wt$ (l = length; w = width; t = thickness in centimeters),
depends on the diameter of the probe tip and the I.D. of the crescent. For a tip diameter of $\approx 0.0005$ cm and a crescent I.D. of $\approx 0.0025$ cm, the NiFe between the crescent and probe will have a resistance $R_{CP} \cong 4.5 \ \Omega$.

For a resistance in the two conductor lines of $R_L = 4 \ \Omega$, (based on calculations for 5,000 Å thick gold lines 0.0008 cm wide $\times$ 0.025 cm long) and a parallel resistance R $\|$ of approximately 20 $\Omega$ through the NiFe film surrounding the conductor area, a change of 0.020 $\Omega$ across the entire resistance network is expected for the difference between a "0" and a "1" data bit.

Based on a maximum allowable current density of 5 $\times$ 10$^6$ amp/cm$^2$ in NiFe, up to 0.014 amp could be sent through the crescent-probe area. Assume the desired operating current between probe and crescent is somewhat less, say 0.009 amp. A total current of 0.015 amp through the complete resistance network would provide 0.006 amp through the surrounding NiFe and 0.009 amp through the crescent-probe area resulting in a detectable voltage change as follows:

$$\Delta V = I \ \Delta R \ (I = 0.015 \text{ amp}; \Delta R = 0.020 \ \Omega)$$
$$\Delta V = 0.015 \times 0.020 = 0.0003 \text{ volts} = 300 \ \mu v = 0.3 \text{ mv}$$

The total resistance between the detector terminals would be approximately 6 $\Omega$. The Johnson noise for 6 $\Omega$ resistance with 100 MHz bandwidth is only about 10 $\mu v$.

What is claimed is:

1. In a magnetic memory system in which bits of binary data are stored as inverted Néel wall sections about an associated Bloch-line, which inverted Néel wall sections are generated in a wall in a magnetizable layer having magnetoresistive properties and in which said binary data are serially propagated along said wall by the intersecting fields provided by associated drive lines, which drive lines have memory segments that are associated with associated memory cells in said magnetizable layer in which associated ones of said bits of binary data are stored as inverted Néel wall sections, a method of magneto-resistively reading out said bits of stored binary data comprising:

conductively coupling to said magnetizable layer a conductive probe along its length and having on one end a tip that is oriented at or near the Bloch-line position in a memory segment of the wall in said magnetizable layer and having the other end of said conductive probe extend along said wall to an edge of said magnetizable layer;

conductively coupling to said magnetizable layer, concentric to and separated from the tip of said conductive probe, a conductive crescent along its length;

coupling an electrical signal across said conductive probe and said conductive crescent; and, determining the resistance in said magnetizable layer between the opposing concentric edges of the tip of said conductive probe and said conductive crescent as an indication of whether or not a Bloch-line is stored in said memory segment.

2. In a cross-tie wall memory system in which bits of binary data are stored as inverted Néel wall sections, which inverted Néel wall sections are bounded by a cross-tie on one end and by a Bloch-line on the other end, of a cross-tie wall in a magnetizable layer having magneto-resistive properties and in which each of said bits is stored in a memory segment that is associated with an associated memory cell in said magnetizable layer, a method of magneto-resistively reading out said bits of stored binary data comprising:

conductively coupling to said magnetizable layer a conductive probe along its length and having on one end a tip that is oriented near the Bloch-line position in a memory segment of the cross-tie wall in said magnetizable layer and having the other end of said conductive probe extend along the surface of said magnetizable layer toward an edge thereof;

conductively coupling to said magnetizable layer, concentric to and separated from the tip of said conductive probe, a conductive crescent along its length;

propagating a Bloch-line along said cross-tie wall and into the area of the tip of said conductive probe, from out of one of said memory segments;

coupling an electrical signal between said conductive probe and said conductive crescent; and, determining the resistance in said magnetizable layer between the opposing concentric edges of the tip of said conductive probe and said conductive crescent as an indication that a Bloch-line had been stored in said one memory segment.

* * * * *

UNITED STATES PATENT AND TRADEMARK OFFICE
CERTIFICATE OF CORRECTION

PATENT NO. : 4,141,080
DATED : February 20, 1979
INVENTOR(S) : MAYNARD CARLTON PAUL, et al It is certified that error appears in the above-identified patent and that said Letters Patent are hereby corrected as shown below:

Column 6, Line 8

"$R_{"0"} = \Delta R_{MAX} = R_{MIN}$" should be

-- $R_{"0"} = \Delta R_{MAX} + R_{MIN}$ --.

Column 6, Line 12

"$R_{"1"} = RMIN$" should be -- $R_{"1"} = R_{MIN}$ --.

Signed and Sealed this

Seventeenth Day of July 1979

[SEAL]

Attest:

LUTRELLE F. PARKER
*Attesting Officer*     *Acting Commissioner of Patents and Trademarks*